United States Patent [19]

Proud, Jr. et al.

[11] 4,127,784
[45] Nov. 28, 1978

[54] LIGHT ACTIVATED SOLID STATE MICROWAVE GENERATORS

[75] Inventors: Joseph M. Proud, Jr., Wellesley Hills; Scott L. Norman, Framingham; Charles N. Fallier, Jr., Westford, all of Mass.

[73] Assignee: GTE Laboratories Incorporated, Waltham, Mass.

[21] Appl. No.: 757,259

[22] Filed: Jan. 6, 1977

[51] Int. Cl.² .................. H03K 17/00; H04D 3/04
[52] U.S. Cl. .............................. 307/311; 307/241; 333/20; 250/211 J
[58] Field of Search .............. 307/311, 241; 333/20; 250/211 J; 357/30, 86

[56] References Cited

U.S. PATENT DOCUMENTS

| | | | |
|---|---|---|---|
| 3,509,351 | 4/1970 | Stuckert | 333/20 |
| 3,904,871 | 9/1975 | Dueker et al. | 250/211 J |
| 3,917,943 | 11/1975 | Auston | 250/211 J |

Primary Examiner—Stanley D. Miller, Jr.
Assistant Examiner—B. P. Davis
Attorney, Agent, or Firm—Irving M. Kriegsman; Fred Fisher

[57] ABSTRACT

A light activated solid state microwave generator capable of providing radio frequency pulse bursts includes a plurality of optoelectronic switches arranged on a common substrate for simultaneous activation thereof and a plurality of distributed transmission lines connected in series and properly terminated by the switches upon activation by light.

7 Claims, 10 Drawing Figures

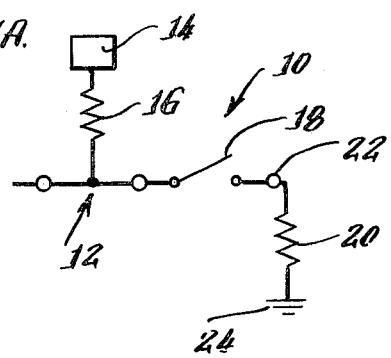
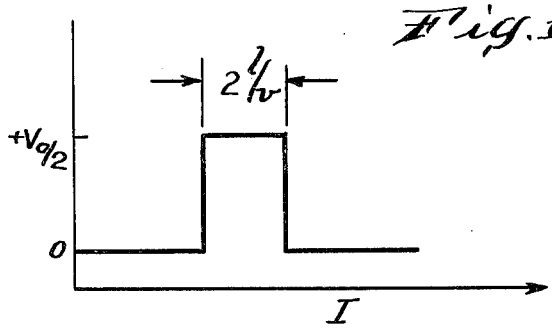
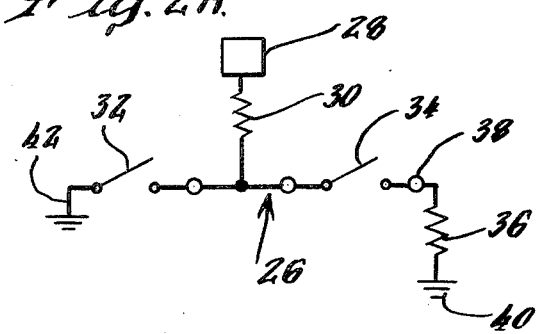
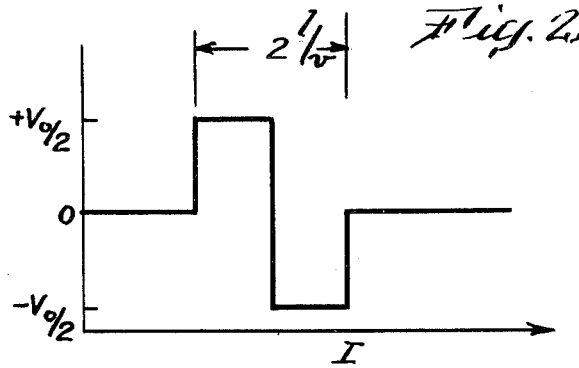
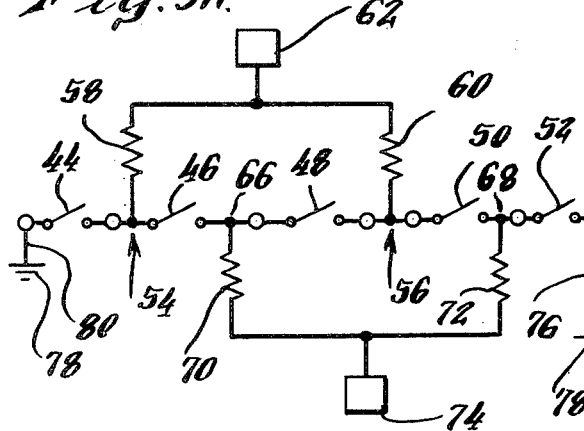
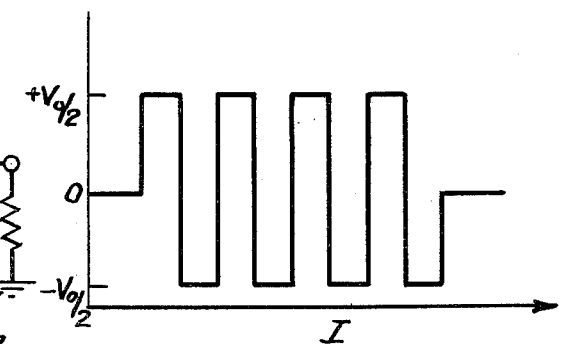
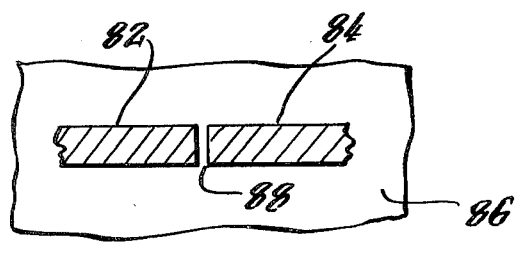
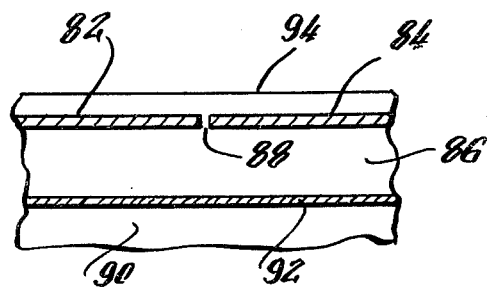

LIGHT ACTIVATED SOLID STATE MICROWAVE GENERATORS

The invention herein described was made in the course of or under a contract or subcontract thereunder, with the Department of the Air Force.

BACKGROUND OF THE INVENTION

This invention relates to radio frequency pulse generating device and, in particular, to a light activated solid state generator capable of providing pulse bursts at microwave frequencies.

The prior art abounds with various methods for generating pulses of power at microwave frequencies. A particular family of microwave pulse generators utilize liquid or gaseous dielectric spark gaps to perform the relatively fast switching function. One technique utilizes these switches in a circuit arrangement commonly known as a frozen wave generator. This type of generator was capable of providing intense radio frequency pulses for plasma heating at frequencies having an upper limit approaching 1 MHz and later was improved to have an upper frequency limit approaching 200 MHz. However, since this technique requires simultaneous switching of a plurality of spark gaps, it has been plagued with problems of seemingly irreducible jitter inherently associated with spark gap switches. On the other hand, semiconductors, which are generally capable of jitter-free operation, are generally limited to operation at relatively low power levels because of the manner in which mobile charges are injected and depleted within the material.

The photoconducting properties of semiconducting materials are well known in the art; however, the development of a quasi-metallic photoconducting state in materials such as silicon has been demonstrated only recently. Lasers delivering microjoule-level pulses to areas of about 1mm$^2$ have been known to produce quasi-metallic photoconduction in silicon with a corresponding change in conductance from $10^{-4}$ (ohm-cm)$^{-1}$ to $10^3$ (ohm-cm)$^{-1}$. The switching of the silicon is limited only by the optical pulse since the dielectric relaxation time is less than 1 psec. Electrical voltages, 100 volts and higher, are capable of being switched in this manner. In U.S. Pat. No. 3,917,943 to D. H. Auston, there is disclosed a means for obtaining pulse widths of 15 psec at power levels in the order of 100 watts. Also known in the art are light-activated multilayer silicon devices that provide nanosecond-risetime switching with multimegawatts of peak power. A typical light activated solid state switching device is disclosed in U.S. Pat. No. 3,893,153 to Derrick J. Page and John S. Roberts issued July 1, 1975.

The present invention overcomes the shortcomings of the prior art relating to frozen wave generators by utilizing solid state switches which makes use of the injection of charge by photon absorption. The photon absorption phenomenon is only limited by the speed of the light pulse risetime. As a result, fast switching may be obtained at potentials up to those required for the electrical breakdown of the bulk material.

Therefore, it is an object of the present invention to provide a light activated switching generator capable of providing jitter-free pulses at microwave frequencies.

It is a further object of the present invention to provide a light activated solid state microwave generator capable of providing jitter-free pulses at microwave frequencies.

Another object of the present invention is to provide an array of solid state optoelectronic switches capable of generating bursts of radio frequency pulses from a DC input voltage source.

A further object of the present invention is to provide a solid state switching generator for generating microwave power at higher power levels than known heretofore.

Still another object of the present invention is to provide a solid state switching microwave generator capable of providing pulses at higher frequencies than known heretofore.

Yet another object of the present invention is to provide an optoelectronic solid state circuit arrangement capable of generating a frozen wave at microwave frequencies.

The foregoing and other objects and advantages will appear from the description to follow. In the description, reference is made to the accompanying drawing which forms a part thereof, and in which is shown by way of illustration a specific embodiment for practicing the invention. This embodiment will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the invention is best defined by the appended claims.

SUMMARY OF THE INVENTION

A light activated solid state microwave switching generator, according to the principles of the present invention, comprises a plurality of semiconductor optoelectronic switches disposed on a substrate for simultaneous activation by a source of light, a radio frequency transmission line coupled to each of the switches and disposed proximate thereto, each of the transmission lines arranged to be serially connected upon activation of the switches, means for coupling a DC voltage to each of the transmission lines, electrically conductive shorting means, the shorting means arranged to be connected to one end of the serially connected transmission line upon activation of the switches; and means connected to the other end of the serially connected transmission line for obtaining an output signal.

BRIEF DESCRIPTION OF THE DRAWING

In order that the invention may be more fully understood, it will now be described by way of example, with reference to the accompanying drawing in which:

FIGS. 1A, 2A and 3A are schematic circuit diagrams of circuit arrangements for obtaining a frozen wave;

FIGS. 1B, 2B and 3B are the wave forms obtained from the respective circuit arrangements shown in FIGS. 1A, 2A and 3A;

FIG. 4A is a top plan view of solid state microwave switch utilizing the principles of the present invention;

FIG. 4B is a cross-sectional view in elevation of the solid state switch shown in FIG. 4A;

DESCRIPTION OF THE PREFERRED EMBODIMENT

Figure 5:
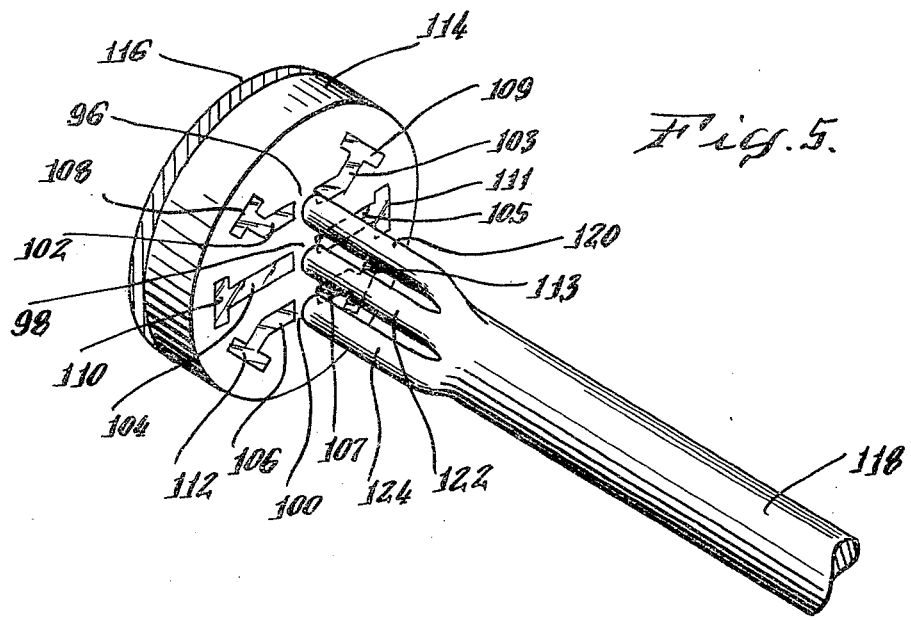
FIG. 5 is a pictorial representation of a plurality of solid state optoelectronic switches disposed on a wafer and arranged for simultaneous activation by a light source.

In order to best understand the features and advantages of the present invention, it is best to review the status of the prior art. The known frozen wave technique and concept has been extended by the principles set forth in the present invention to enable jitter-free frozen waves to be obtained at microwave frequencies.

Known in the prior art is a technique wherein a first laser pulse having a wavelength of approximately 0.53μm generates a first switch closure; this is followed by a second delayed laser pulse at approximately 1.06μm to shunt the transmission path to the ground plane of the transmission line forming a pulse at microwave frequencies.

Referring now specifically to the circuit arrangement 10 of FIG. 1A, a length of transmission line (l) 12 is charged to an initial potential (Vo), provided by a D.C. voltage source 14, through a resistor 16. Upon closure of a switch 18 a rectangular voltage pulse of width $2l/v$ will be obtained across matched load resistor 20 connected between the transmission line conductor 22 and ground reference 24, as shown in FIG. 1B; where $v$ is the electromagnetic propagation velocity in transmission line 12.

The circuit arrangement of FIG. 2A illustrates a frozen wave generator in its simplest form. A length (l) of transmission line 26 is charged to an initial potential ($V_o$), provided by a DC voltage source 28, via a resistor 30 whereupon switches 32 and 34 are closed simultaneously. A load resistor 36 is connected between the transmission line conductor 38 and ground reference 40. A forward-propagating wave of height $V_o/2$ and length $l/v$ is launched toward the matched load resistor 36. A reflecting short 42 to ground reference 40 produces a pulse height of $-V_o/2$ and width of $l/v$ to form, with the forward wave, a single cycle of frequency $v/2l$ as shown in FIG. 2B.

FIG. 3A illustrates a further extension of this technique and utilizes a plurality of synchronized switches 44, 46, 48, 50 and 52. Two segments of transmission line 54 and 56 are initially charge via resistors 58 and 60 respectively to a potential ($V_o$) provided by DC voltage source 62. Two other transmission line segments 66 and 68 are initially charge via resistors 70 and 72, respectively, to a potential ($-V_o$) provided by a negative DC voltage source 74. Load resistor 76 is connected between the transmission line conductor 68 and ground reference 78. A reflecting short 80 is provided between the transmission line conductor 54 and reference ground 78 upon closure of switch 44. Simultaneous closure of switches 44, 46, 48, 50 and 52 generates the traveling frozen wave as shown in FIG. 3B.

It is obvious that yet other pulse shapes are possible, e.g. pulse trains with more radio frequency cycles, pulse trains having axis crossing at irregular intervals, or pulse trains having a predetermined amplitude modulation. The details of the pulse train (shape) are determined by the lengths and impedances of the transmission line segments joining the simultaneously-actuated optoelectronic switches.

To be feasible at microwave frequencies, the frozen wave generator must incorporate switches capable of withstanding high voltages for a period of time corresponding to application of the DC voltage. Following this hold-off period, the switches must close on command with closure times in the subnanosecond region. In the closed state, the switches must exhibit low series impedance such that a radio frequency circuit is established with little mismatch or loss.

FIG. 4A is a top plan view of a typical semiconductor optoelectronic switch in which metalized microstrip (stripline) transmission lines 82 and 84 are placed on a 0.020 inch thick wafer 86 of $10^4$ ohm-cm silicon with the gap 88 therebetween ranging from 0.005 to 0.025 inches. The stripline forms a distributed parameter transmission line as is well known by those knowledgeable in the art. FIG. 4B is a side-view plan of the aforementioned switch. Typically, the silicon wafer is insulated from the substrate 90 by a layer 92 of 0.002 inch plastic film (such as polyethylene terephthate sold under the trademark "Mylar") to reduce current drain through the wafer 86. A passivating dielectric film 94 may be provided over the stripline to provide electrical and chemical stability by isolating the surface from the environment.

One embodiment of the present invention is shown in FIG. 5 which includes three microwave optoelectronic switches 96, 98 and 100 with metallized conductors 102 and 103; 104 and 105; and 106 and 107 connected to terminal pads 108 and 109; and 110 and 111; and 112 and 113, respectively. All of which are disposed on a silicon wafer 114 and having a polyethylene layer 116 affixed thereon prior to mounting on a ground plane, not shown. Each of the terminal pads 108, 109, 110, 111, 112 and 113 are adapted to be connected to conventional transmission lines formed of cables, not shown. The optoelectronic switches are disposed in a relatively straight line where they may be simultaneously activated by light appearing in the light pipe 118 which has been separated into sections 120, 122 and 124 to align with and be in juxtaposition with switches 96, 98 and 100.

Figure 6:
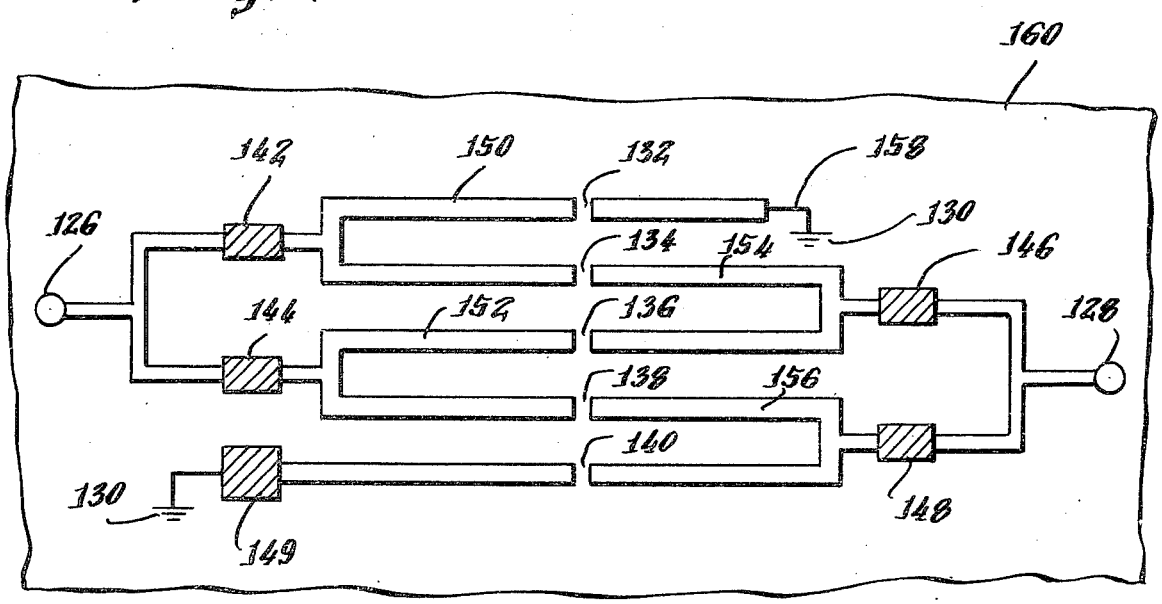
FIG. 6 is a top plan view of a solid state optoelectronic circuit arrangement utilizing the principles of the present invention to obtain the frozen wave shown in FIG. 3B.

FIG. 6 is a top plan view of circuit arrangement utilizing stripline (distributed transmission line) to obtain the wave shape shown in FIG. 3B and conforms with the circuit arrangement shown in FIG. 3A. The voltage sources 62 and 74 are to be connected to terminal pads 126 and 128 respectively. The ground reference 130 is the same as reference 78 of FIG. 3A. Switches 132, 134, 136, 138 and 140 are equivalent to switches 44, 46, 48, 50 and 52. Resistors 142, 144, 146, 148 and 149 are equivalent to resistors 58, 60, 70, 72 and 76. The transmission lines 150, 152, 154 and 156 are equivalent to transmission lines 54, 56, 66 and 68. The reflecting short 158 is equivalent to short 80, all of which are mounted on a wafer 160.

The optoelectronic switches 132, 134, 136, 138 and 140 are disposed in a straight line and are adapted to be activated by a source of light, not shown, which may be similar to the light pipe 118 shown in FIG. 5 or may be of any suitable optical arrangement. Preferably, the light should be in the 3000 to 6000 Angstroms (A°) range. The depth of penetration, and, therefore, the volume of material activated, is wavelength dependent. Thus, shorter wavelengths do not penetrate the silicon sufficiently to be effective, while larger wavelengths may penetrate too deeply. The output pulse train shown in FIG. 3B will appear across lead resistor 149 each time the optoelectronic switches are activated by light. The pulse source of light was a nitrogen ($N_2$) gas laser in the experimental model where stable radio frequency pulse burst operation was obtained. Unlike many spark gap switches, statistical processes do not dominate conduction, therefore zero jitter is obtainable. However, the current closely follows the light pulse, and the rapidity of switch closure is detemined by the laser pulse risetime. It appears that the use of a mode-locked laser would enable frequencies as high as 100 GHz to be obtained.

Heretofore, a light activated solid state microwave switching generator capable of relatively jitter-free operation at microwave frequencies has been disclosed. It will be understood that various changes in the details, materials, arrangements of parts and operating conditions which have been herein described and illustrated in order to explain the nature of the invention may be made by those skilled in the art within the principles and scope of the invention.

Having thus set forth the nature of the invention what is claimed is:

1. A light activated solid state microwave switching generator comprising:
   a. a plurality of semiconductor optoelectronic switches disposed on a substrate for simultaneous activation by a source of light;
   b. a radio frequency transmission line coupled to each said switch and disposed proximate thereto; each said transmission line being serially connected upon activation of said switches;
   c. means for coupling a DC voltage to each said transmission line;
   d. electrically conductive shorting means, said shorting means being connected to one end of said serially connected transmission line upon activation of said switches; and
   e. means connected to the other end of said serially connected transmission line for obtaining an output signal.

2. A light activated solid state microwave switching generator according to claim 1 wherein said substrate is a high resistivity semiconducting medium.

3. A light activated solid state microwave switching generator according to claim 2 wherein said radio frequency transmission line is a distributed parameter transmission line utilizing said substrate to assist in providing the required transit times.

4. A light activated solid state microwave switching generator according to claim 2 wherein said substrate medium is silicon.

5. A light activated solid state microwave switching generator according to claim 1 wherein said substrate is a semiconducting medium and said radio frequency transmission lines are distributed parameter transmission lines utilizing said medium to provide the required transit times.

6. A light activated solid state microwave switching generator according to claim 1 wherein said optoelectric switches are adapted to be activated by light in the range of approximately 3000 to 6000 Angstroms (A°).

7. A light activated solid state microwave switching generator according to claim 1 wherein said voltage coupling means couples said DC voltage of given polarity to each said transmission line in parallel.

* * * * *